(12) United States Patent
Lenssen

(10) Patent No.: US 6,215,301 B1
(45) Date of Patent: Apr. 10, 2001

(54) MAGNETORESISTIVE DETECTOR COMPRISING A LAYER STRUCTURE AND A CURRENT DIRECTING MEANS

(75) Inventor: Kars-Michiel H. Lenssen, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/174,788

(22) Filed: Oct. 19, 1998

(30) Foreign Application Priority Data

Apr. 24, 1998 (EP) .................................................. 98201343

(51) Int. Cl.$^7$ ................................................ G01R 33/02
(52) U.S. Cl. .......................................... 324/252; 428/209
(58) Field of Search ........................... 324/207.21, 207.2, 324/252; 360/113; 338/32 R; 428/209–210, 688, 900, 901

(56) References Cited

U.S. PATENT DOCUMENTS

| | | | | |
|---|---|---|---|---|
| 4,024,489 | * | 5/1977 | Bajorek et al. ..................... | 338/32 R |
| 5,432,373 | * | 7/1995 | Johnson ............................. | 360/113 |
| 5,474,833 | | 12/1995 | Etienne et al. ..................... | 428/209 |
| 5,886,523 | * | 3/1999 | Gibbs et al. ........................ | 325/252 |

FOREIGN PATENT DOCUMENTS 0712117   11/1995  (EP) .

OTHER PUBLICATIONS

"Perpendicular giant magnetoresistance of Co/Cu multilayers deposited under an angle on grooved substrates", by M.A.M. Gijs et al., Appl. Phys. Lett. 66(14), Apr. 3. 1995, pp. 1839–1841.

* cited by examiner

Primary Examiner—Jay Patidar
(74) Attorney, Agent, or Firm—Steven R. Biren

(57) ABSTRACT

Element comprising a substrate (101) having a layer structure (103) bounded by two parallel main faces (105a, 105b) with at least two layers of mutually different magnetical behavior. The layer structure has a zone (109) which, viewed in a direction parallel to the main faces, extends between spaced electric connection areas (107a, 107b). A current-directing means is present in this zone for producing, during current passage, a current component ($c_p$) directed transversely to the layer structure, which means comprises at least one electric conductor (111a, 111b) on at least one of the main faces.

12 Claims, 4 Drawing Sheets

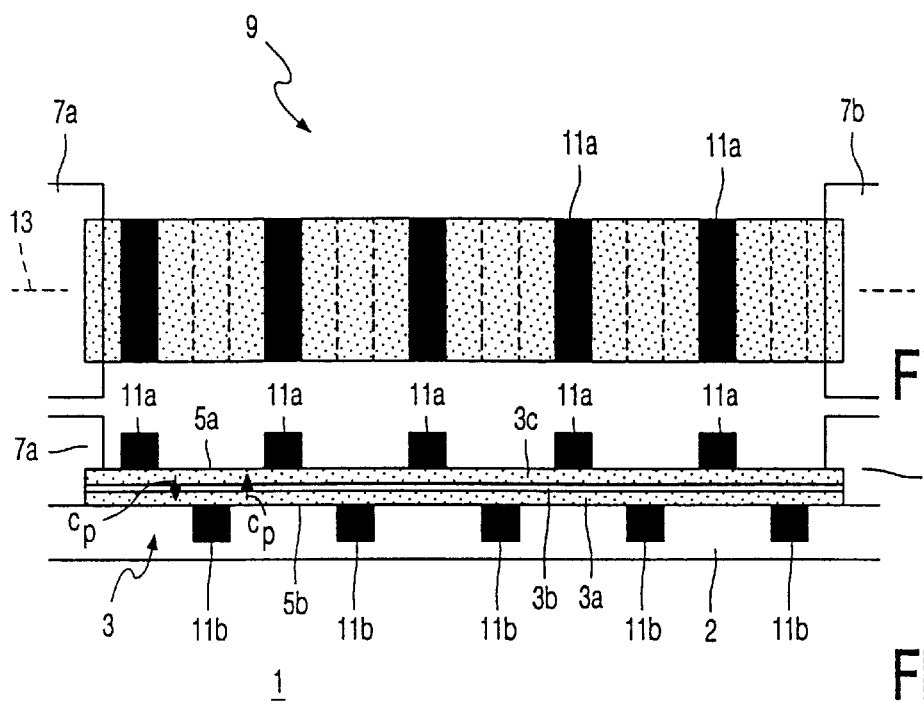
FIG. 1A
FIG. 1B
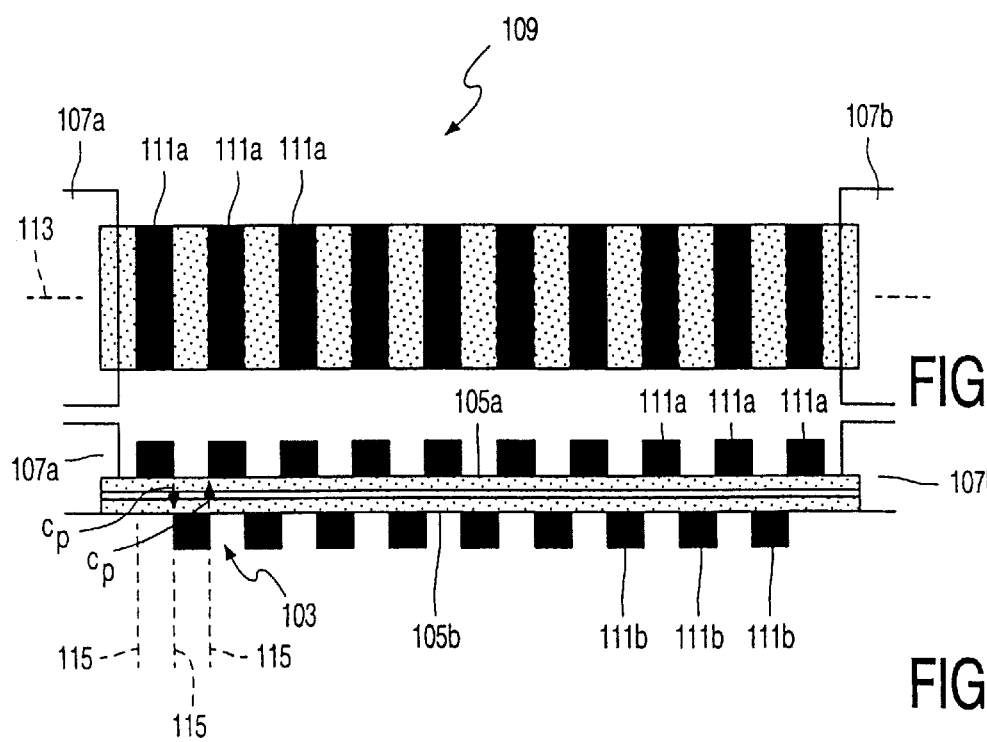
FIG. 2A
FIG. 2B

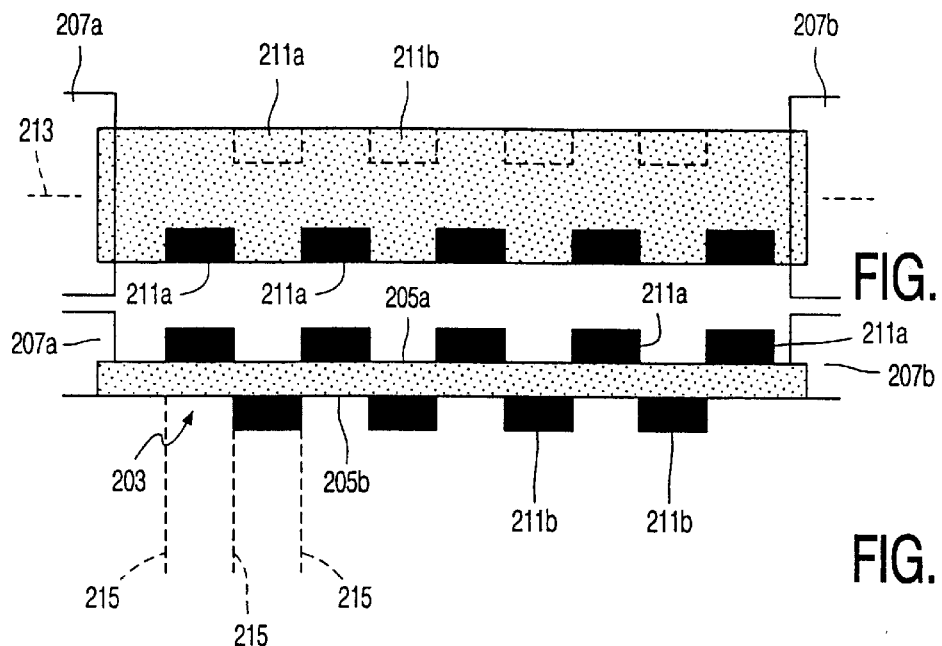
FIG. 3A
FIG. 3B
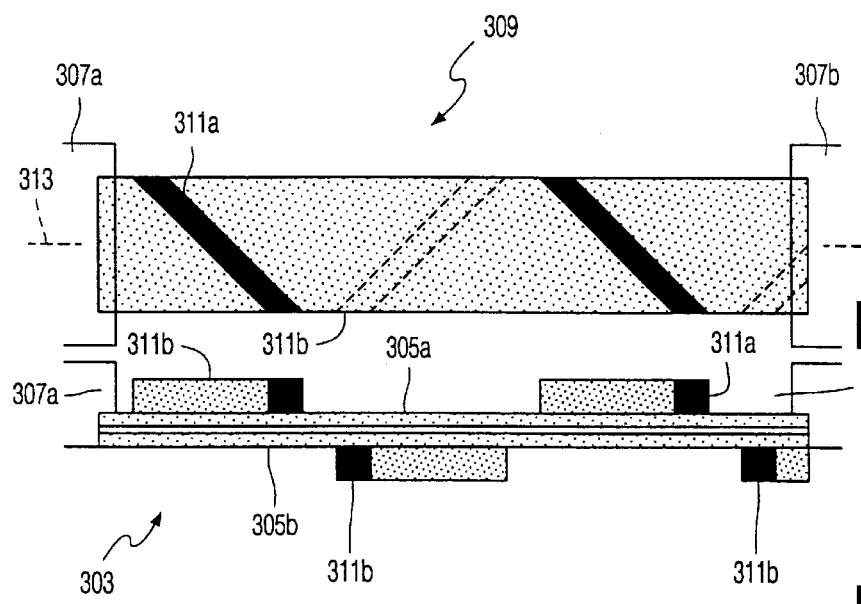
FIG. 4A
FIG. 4B

MAGNETORESISTIVE DETECTOR COMPRISING A LAYER STRUCTURE AND A CURRENT DIRECTING MEANS

BACKGROUND OF THE INVENTION

The invention relates to an element comprising a layer structure bounded by two substantially parallel main faces, having at least two layers of mutually different magnetical behavior, the layer structure having a zone which, viewed in a direction parallel to the main faces, extends between spaced electric connection areas, in which zone a current directing means is present for producing, during current passage, a current component directed transversely to the layer structure.

Such an element is known as a magnetoresistive detector from U.S. Pat. No. 5,474,833. The known element comprises a stack of layers of different magnetical properties. The layer structure thus formed is present on a substrate and has two electrodes which are localized on two facing ends of the layer structure, The stack of layers is provided with one or more interruptions of electric conductance. These interruptions are obtained by locally performed etching operations in order to form a square-shaped structure in the zone between the electrodes. In this structure, the electric current is forced, during current passage, to pass the layers more or less perpendicularly.

A drawback of the known element is the method of its manufacture, notably because the formation of the square-shaped structure requires complicated etching processes.

OBJECTS AND SUMMARY OF THE INVENTION

It is an object of the invention to improve the element described in the opening paragraph in such a way that it is easily obtainable.

To this end, the element according to the invention is characterized in that the current-directing means on at least one of the main faces comprises at least one electric conductor.

This measure, in which the current-directing means is present outside the layer structure, provides the possibility of passing an electric current perpendicularly or at least with a perpendicular component through the layers of the layer structure without having to adapt the structure of the layers themselves for this purpose. The current-directing means forces the electric current from the exterior into a desired direction. In principle, the layer structure, which is generally provided on a substrate, may be any type of GMR system, such as spin valve, hard/soft multilayer, AF-coupled multilayer. In such a system, the angle between the directions of magnetization as a function of a magnetic field changes as a result of mutually different magnetical behavior of layers present in the layer structure.

It is known per se that the giant magnetoresistance effect (GMR effect) of a layer structure as used in the element is greater in the presence of an electric current passing perpendicularly through the layers than in the presence of an electric current passing in the plane of the layers. The article Appl. Phys. Lett. 66 (14), Apr. 3, 1995, pp. 1839–1841 "Perpendicular giant magnetoresistance of Co/Cu multilayers deposited under an angle on grooved substrates", M. A. M. Gijs et al. further describes the advantages of a CPP geometry, with CPP standing for "current perpendicular to layer plane" as compared with a CIP geometry, with CIP standing for "current in-plane". This publication proposes to provide a multilayer on a grooved substrate so as to realize a perpendicular current passage through the layers. Although a greater GMR effect is indeed achievable in this way, the known proposal has a number of drawbacks. First, the manufacture of the necessary micro-structured substrates requires specific techniques, which renders the substrates expensive. Moreover, it is not easy to realize a good multilayer without shunting, and since deposition under a well-defined angle is often required, the customary sputter deposition processes are not possible or not possible without any further measures. Said article proposes vapor deposition for the formation of the multilayer. Apart therefrom, the grooved substrate leads to a complicated micro-structure and texture of the multilayer materials.

Unlike the known CPP geometries, the CPP geometry realized in the element according to the invention has the advantage that the novel concept is independent of the type of layer structure and the deposition method used. A further advantage is that the concept does not require any new materials or processes. Moreover, the electric connection areas may be present at locations which are customary in CIP geometries.

in that the current directing means on both main faces include at least an electric conductor, the electric conductor or conductors on one main face being offset with respect to the electric conductor or conductors on the other main face in a direction towards one of the electric connection areas. Due to the presence of one or more electric conductors on both sides of the layer structure, the electric current passes the layer structure at least once completely during operation. In the presence of different conductors on both sides, a zigzag-shaped passage pattern is produced, with the electric current repeatedly crossing the interfaces between the layers which are present.

It is to be noted that a read/write head with a GMR element is known from EP-A 0 712 117, in which the GMR element is placed between two electric contact elements which are positioned directly opposite each other and sandwich the GMR element. The system constituted by the GMR element and both contact elements is present between two electrically conducting, magnetic layers. During scanning, an electric current flows perpendicularly through the GMR element. This read/write head entirely deviates from the customary CIP geometries due to the contact elements which are positioned directly opposite each other and opposite the GMR element. Moreover, the known system has the drawback that the total resistance to which a read current is subjected is relatively small, which is unfavorable for the output signal and hence for the signal-to-noise ratio of the read signal obtained.

in that the conductor or conductors on the one main face and the conductor or conductors on the other main face are located opposite each other in a non-overlapping position. It has been found that the most favorable effect on the output signal is obtained if the conductor or conductors on one main face are not present in the area or areas exactly opposite the conductor or conductors on the other main face. This effect is achieved by the relatively large resistance to which the current is subjected.

in that the conductor or conductors on the on the one main face and the conductor or conductors on the other main face at least substantially bound the same plane or planes, respectively, oriented transversely to the main faces. In this embodiment, the distance between the electric conductor present on the one or the other main face or, in the presence of more electric conductors, between the conductors alternately present on the one and the other main face is minimal, which results in an optimal CPP geometry.

An embodiment of the element according to the invention is characterized in that the conductor or conductors is, or are, strip-shaped. The strip-shaped conductor or conductors is, or are, preferably formed from a satisfactorily conducting metallic material or metal such as Au. Due to the great difference in resistance which is achievable between a strip-shaped conductor and the layer structure, the electric current flows within a relatively small area near the edges of the conductor during current passage, which results in a relatively large CPP resistance. Moreover, an automatic series connection of contiguous current paths takes place, which leads to a relatively large total resistance and hence to a relatively large GMR effect.

in that the conductor substantially extends in a direction transverse to a connection axis through the electric connection areas. Unlike the electrically conducting strips which, as presumed to be known, are used on an AMR element (anisotropic magnetoresistive element) for linearization of the magnetoresistive element and are arranged at an angle of 45° to the longitudinal axis of the AMR element, the strip-shaped conductor or conductors may be oriented perpendicularly to the connection line between the connection areas. This orientation has a favorable effect on the prevention of shunting.

In this embodiment, not only a perpendicular current component is created, but a bias is achieved which has a favorable effect on the stability of the element. In a preferred embodiment, the angle is at least substantially 45°.

An embodiment of the element according to the invention is characterized in that the conductor or conductors is, or are, dot-shaped. In this embodiment, the current is transported substantially entirely through the layer structure. As compared with a pattern of strip-shaped conductors, a pattern of dot-shaped conductors is considerably simpler, which is advantageous in the case of miniaturization.

If desired, the material of the strip or dot-shaped conductor or conductors themselves may be magnetoresistive. If the thickness is chosen to be considerably larger than the thickness of the layer structure, the resistance is sufficiently small to generate a perpendicular current component in the layer structure. In this way, a current-directing means can be realized which contributes to the MR effect to a considerable extent.

The invention also relates to a variant of the element according to the invention, comprising a layer structure bounded by two substantially parallel main faces, having at least two layers of mutually different magnetical behavior and with electric connection areas, a current-directing means being present for producing, during current passage, a current component directed transversely to the layer structure. According to the invention, this element is characterized in that the current-directing means comprises a pair of non-overlapping or substantially non-overlapping conductors, one of the conductors being present on one of the main faces in one of the electric connection areas and the other conductor being present on the other main face in another electric connection area. Ultra-small CPP structures can be realized with this element, which structures are eminently suitable for use in magnetic memories and in magnetic heads, particularly high-density data heads.

Another embodiment of the element is characterized in that the conductors bound the same plane oriented transversely to the main faces. Since the width of the area across which a current crosses from the layer structure to a conductor, or vice versa, is approximately proportional to the thickness of the layer structure, and since this thickness is much smaller than the accuracy which is achievable when using customary lithographic techniques, it is advantageous not to position the electric conductors opposite each other but to offset them to such an extent that both of them bound one plane oriented transversely to the main faces.

The invention also relates to a magnetic head comprising an element according to the invention, wherein the layer structure constitutes a transducing element. The magnetic head may be a read head or a read portion of a combined read/write head and may be intended for co-operation with a magnetic tape or a magnetic disc.

The invention further relates to a magnetic field sensor which comprises an element according to the invention, wherein the layer structure constitutes a sensor element. Such a sensor may be used as, for example, an angle sensor, a position sensor or a current sensor.

The invention further relates to a magnetic memory comprising an element according to the invention.

These and other aspects of the invention are apparent from and will be elucidated with reference to the embodiments described hereinafter.

BRIEF DESCRIPTION OF THE DRAWING

In the drawings:

FIG. 1A is a diagrammatic plan view of a first embodiment of the element according to the invention, FIG. 1B is a diagrammatic elevational view of the first embodiment, FIG. 2A is a diagrammatic plan view of a second embodiment of the element according to the invention, FIG. 2B is a diagrammatic elevational view of the second embodiment, FIG. 3A is a diagrammatic plan view of a third embodiment of the element according to the invention, FIG. 3B is a diagrammatic elevational view of the third embodiment, FIG. 4A is a diagrammatic plan view of a fourth embodiment of the element according to the invention, FIG. 4B is a diagrammatic elevational view of the fourth embodiment.

DESCRIPTION OF THE PREFERRED EMBODIMENTS

Figure 5:
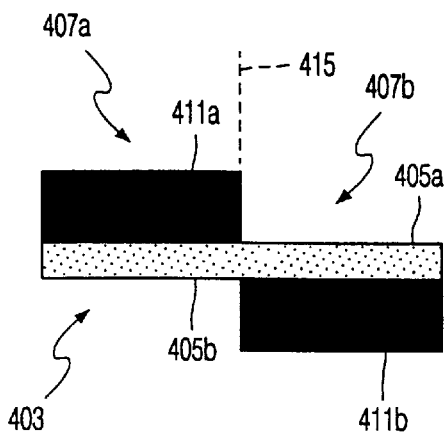
FIG. 5 is a diagrammatic elevational view of a fifth embodiment of the element according to the invention.

The embodiment of the element according to the invention, shown in FIGS. 1A and 1B, comprises a substrate 1 of, for example silicon, having a layer structure 3 with three layers in this example, namely a first layer 3a of, for example NiFe, a second layer 3b of, for example Cu, and a third layer 3c of, for example Co. The layer structure constitutes a GMR system. An insulation layer 2 of, for example $Al_2O_3$ extends between the substrate 1 and the layer structure 3. The layer structure 3 may be provided with a buffer layer and/or coating, both of, for example Ta. The layer structure 3 is bounded by two mutually parallel main faces 5*a* and 5*b* and has two electric connection areas 7*a* and 7*b* and a zone 9 extending between these connection areas 7*a* and 7*b*. A current-directing means for producing, during current passage, a current component $c_p$ directed transversely to the layer structure is present in the zone 9. The current-directing means comprises strip-shaped electric conductors of, for example copper, a first set of conductors 11*a* being present in this embodiment on the main face 5*a*, and a second set of conductors 11*b* being present on the main face 5*b*. The conductors 11*a* and 11*b* are substantially perpendicularly oriented with respect to a connection axis 13 through the connection areas 7*a* and 7*b*, the conductors 1 1a on the main face 5*a* being offset along the connection line 13 with respect to the conductors 11*b* on the main face 5*b*, while the conductors 11*a* do not overlap the conductors 11*b*. Upon current passage, an electric current repeatedly passes the layer structure 3, with a crossover taking place from one of the conductors 11*a* or 11*b* on one main face to a most proximate conductor 11*b* or 11*a*, respectively, on the other main face.

The embodiment of the element according to the invention, shown in FIGS. 2A and 2B, comprises a substrate which has a layer structure 103 bounded by two substantially parallel main faces 105*a* and 105*b*, which layer structure has at least two layers of mutually different magnetical behavior. The layer structure 103 has a zone 109 which, viewed in a direction parallel to the main faces 105*a* and 105*b*, extends between two spaced electric connection areas 107*a* and 107*b*. Electric conductors for producing, during current passage, a current component $c_p$ directed transversely to the layer structure 103 are present in this zone 109. Of these conductors, a number of conductors 111*a* is present on the main face 105*a* and a number of conductors 111*b* is present on the main face 105*b*. The conductors 111*a* and 111*b* used are strip-shaped and extend in a direction transverse to a connection axis 113 through the electric connection areas. The connection axis corresponds to the longitudinal axis of the element. The electric conductors 111*a* or 111*b* on one main face are offset with respect to the electric conductors 111*b* and 111*a*, respectively, on the other main face in a direction towards one of the electric connection areas 107*a* and 107*b*, the conductors 111*a* or 111*b* on the one main face and the conductors 111*b* and 111*a* on the other main face being located opposite each other in a non-overlapping position, and the conductors 111*a* or 111*b* on one main face and the conductors 111*b* and 111*a* on the other main face bounding the same planes 115 oriented transversely to the main faces and the connection axis 113.

The embodiment of the element according to the invention, shown in FIGS. 3A and 3B, comprises a substrate 201 having a layer structure 203 with the following successive layers: a layer of Ta, a layer of NiFe, a layer of Cu, a layer of NiFe, a layer of FeMn and a layer of Ta. The layer structure 203 which is bounded by two parallel main faces 205*a* and 205*b* has a zone 209 which extends between two connection areas 207*a* and 207*b*. A current-directing means comprising dot-shaped conductors is present in the zone 209. Of these conductors, a first set of dot-shaped conductors 211*a* is present on the main face 205*a* and a second set of dot-shaped conductors 211*b* is present on the main face 205*b*. The dot-shaped conductors 211*a* or 211*b* on one main face are offset with respect to the dot-shaped conductors 211*b* on the other main face in a direction towards one of the electric connection areas 207*a* and 207*b*, all this in such a way that the conductors 211*a* and the conductors 211*b* face each other in non-overlapping positions but preferably bound the same planes 215 oriented transversely to the main faces 205*a* and 205*b* and transversely to the connection axis 213 through the electric connection areas 207*a* and 207*b*.

The embodiment of the element according to the invention, shown in FIGS. 4A and 4B, comprises a substrate having a layer structure 303 of layers having a mutually different magnetical behavior. The layer structure, constituting a GMR system, is bounded by two parallel main faces 305*a* and 305*b*, has two electric connection areas 107*a* and 107*b* and a zone 309 present between these connection areas and provided with means for creating, during current passage, a current component directed transversely to the layer structure 303 as well as a bias of the layer structure. To this end, the means comprises electric strip-shaped conductors 311*a* and 311*b* present on both main faces 105*a* and 105*b*, which conductors extend in this embodiment at an angle of 45° to a connection axis 313 through both connection areas 107*a* and 107*b*, while the conductors 311*a* on the main face 305*a* extend at an angle of 90° to the conductors 311*b* on the main face 305*b*. The conductors 311*a* and 311*b* preferably do not overlap each other.

The embodiment of the element according to the invention, shown in FIG. 5, comprises a layer structure 403 bounded by two parallel main faces 405*a* and 405*b*, with layers of mutually different magnetical behavior and with two electric connection areas 407*a* and 407*b*. In this embodiment, the layer structure constitutes a GMR system composed of CoNiFe/CoFe/Cu/CoFe/CoNiFe. An electric conductor 411*a*, 411*b* of, for example, gold is present in each electric connection area 407*a* and 407*b*, the conductor 411*a* being present on the main face 405*a* and the conductor 411*b* being present on the main face 405*b*. Both conductors 411*a* and 411*b*, which do not overlap each other, constitute a means for producing, during current passage, a current component directed transversely to the layer structure 403. In this embodiment, the conductors 411*a* and 411*b* bound the same plane 415 oriented transversely to the main faces 405*a* and 405*b*. If desired, both conductors may be dimensioned and positioned in such a way that both of them also bound a further plane oriented transversely to the main faces.

Figure 6:
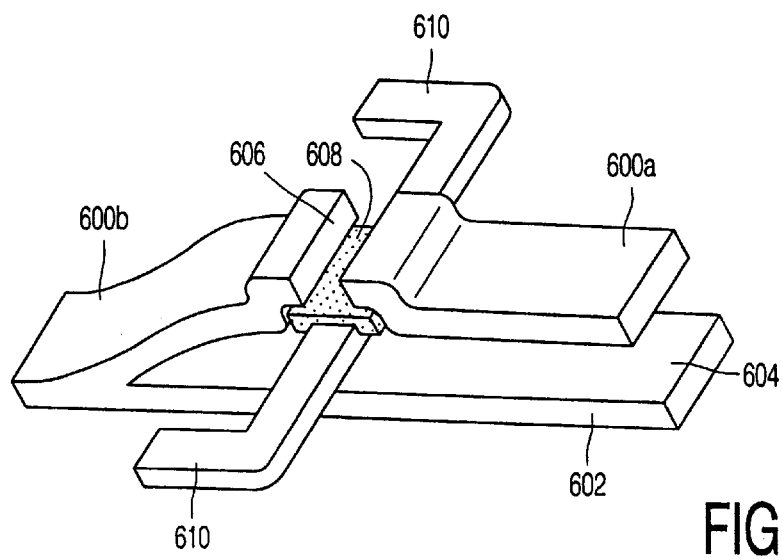
FIG. 6 is a diagrammatic perspective view of an embodiment of the magnetic head according to the invention.

The embodiment of the magnetic head according to the invention, shown in FIG. 6, is a read head and comprises a magnetic yoke and, as a transducing element, an embodiment of the element according to the invention, in which the embodiment of the element may be one of the embodiments shown. The magnetic yoke comprises two magnetic flux guides 600*a*, 600*b* and 602 of, for example NiFe, which flux guides define a read gap 604. The flux guide 600*a*, 600*b* has an interruption 606 which is bridged by the provided element according to the invention, here denoted by the reference numeral 608. In its electric connection areas, the element 608 is electrically connected to electric current conductors 610. The read gap 604 and the interruption 606 are filled with a non-magnetic material such as $SiO_2$ or $Al_2O_3$.

Figure 7:
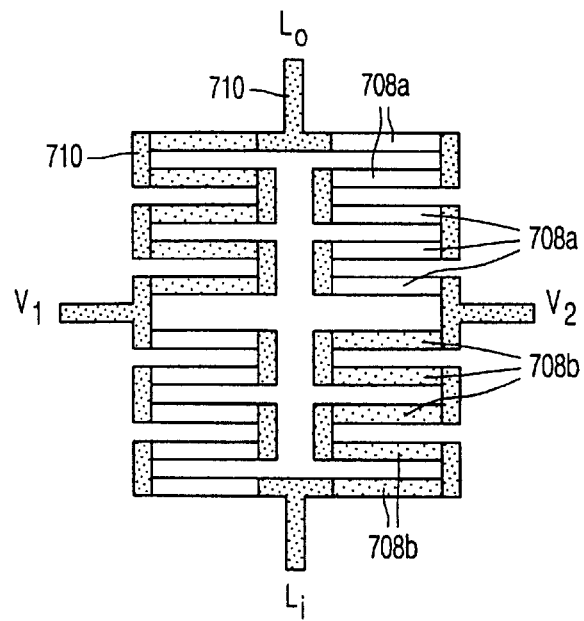
FIG. 7 is a diagrammatic plan view of an embodiment of the magnetic field sensor according to the invention.

The embodiment of a magnetic field sensor according to the invention, shown in FIG. 7, is provided with a number of sensor elements implemented as elements according to the invention. These elements, which may be implemented as one of the embodiments shown in FIGS. 1 to 5, are denoted by the reference numerals 708*a* and 708*b*. The elements 708*a* have an output signal which is opposed to that of the elements 708*b*. Each element 708*a* and 708*b* is switched between electric conductors 710, of, for example, gold and are incorporated, in this embodiment, in a Wheatstoneburg configuration with two current connections $I_i$ and $I_o$ and two voltage measuring points $V_1$ and $V_2$.

Figure 8A:
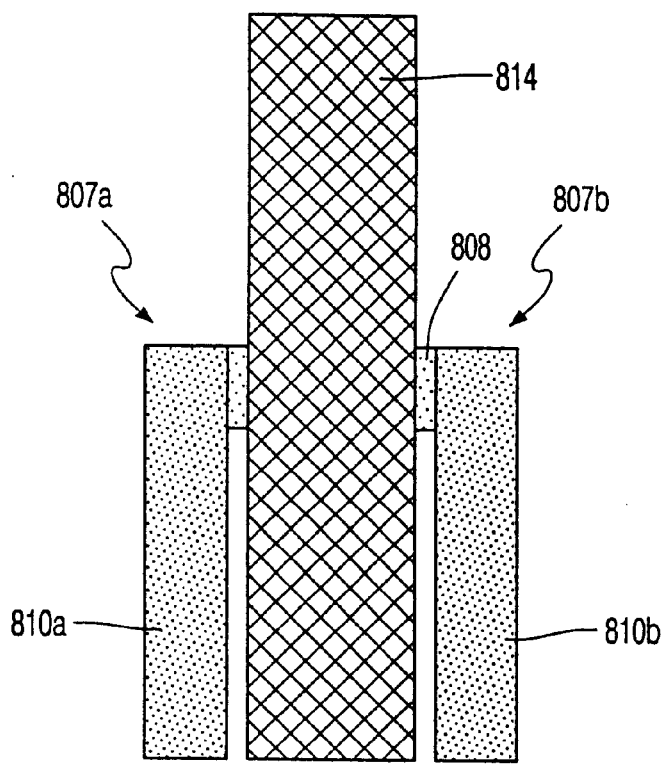
FIG. 8A is a diagrammatic plan view of an embodiment of the magnetic memory according to the invention.
Figure 8B:
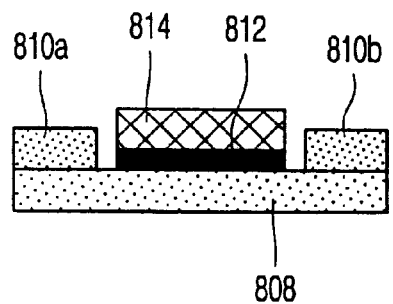
FIG. 8B is a diagrammatic elevational view of the embodiment of the magnetic memory.

The embodiment of the magnetic memory according to the invention, shown in FIGS. 8A and 8B, is provided with an embodiment of the element according to the invention. The element provided is denoted by the reference numeral 808. In its electric connection areas 807a and 807b, the element 808 is electrically connected to current 71 conductors 810a and 810b, respectively, which are used for conducting a read current. Separated from the element 808 by an insulation layer 812 of, for example an oxide, a further current conductor 814 for conducting a write current extends in an area between the conductors 810a and 810b.

It is to be noted that the invention is not limited to the embodiments shown. Variants in which, for example, layer structures other than those shown are used are also within the protective scope of the claims. With reference to the claims, it is further to be noted that various characteristic features as defined in the dependent claims may occur in combination.

What is claimed is:

1. An element comprising a layer structure bounded by two substantially parallel main faces, having at least two layers of mutually different magnetical behavior, the layer structure having a zone which, viewed in a direction parallel to the main faces, extends between spaced electric connection areas, in which zone a current-directing means is present for producing, during current passage, a current component directed transversely to the layer structure, characterized in that the current-directing means on at least one of the main faces comprises at least one electric conductor, and wherein the electrical conductance of the layer structure is substantially uninterrupted.

2. An element as claimed in claim 1, characterized in that the current-directing means on both main faces comprises at least an electric conductor, the electric conductor or conductors on one main face being offset with respect to the electric conductor or conductors on the other main face in a direction towards one of the electric connection areas.

3. An element as claimed in claim 2, characterized in that the conductor or conductors on the one main face and the conductor or conductors on the other main face are located opposite each other in a non-overlapping position.

4. An element as claimed in claim 3, characterized in that the conductor or conductors on the one main face and the conductor or conductors on the other main face at least substantially bound the same plane or planes, respectively, oriented transversely to the main face.

5. An element as claimed in claim 2, characterized in that the conductor or conductors extends or extend at an angle of between 25° and 65° to a connection axis through the connection areas, the conductor or conductors on one main face extending opposite to the conductor or conductors on the other main face.

6. An element as claimed in claim 1, characterized in that the conductor is strip-shaped.

7. An element as claimed in claim 1, characterized in that the conductor substantially extends in a direction transverse to a connection axis through the electric connection areas.

8. A magnetic head comprising an element as claimed in claim 1, wherein the layer structure constitutes a transducing element.

9. A magnetic field sensor comprising an element as claimed in claim 1, wherein the layer structure constitutes a sensor element.

10. A magnetic memory comprising an element as claimed in claim 1.

11. An element comprising a layer structure bounded by two substantially parallel main faces, having at least two layers of mutually different magnetical behavior and with electric connection areas, a current-directing means being present for producing, during current passage, a current component directed transversely to the layer structure, characterized in that the current-directing means comprises a pair of non-overlapping or substantially non-overlapping conductors, one of the conductors being present on one of the main faces in one of the electric connection areas and the other conductor being present on the other main face in another electric connection area.

12. An element as claimed in claim 11, characterized in that the conductors bound the same plane oriented transversely to the main faces.

\* \* \* \* \*